United States Patent [19]
Wolfrey et al.

[11] Patent Number: 5,547,599
[45] Date of Patent: Aug. 20, 1996

[54] FERRITE/EPOXY FILM

[75] Inventors: Austin A. Wolfrey, Holden, Mass.; Samuel L. Bagdasarian, Kissimmee, Fla.

[73] Assignee: Raytheon Company, Lexington, Mass.

[21] Appl. No.: 325,162

[22] Filed: Mar. 17, 1989

[51] Int. Cl.$^6$ .......................... H01F 1/113; H01F 1/117; C08L 63/08

[52] U.S. Cl. .................... 252/62.54; 428/413; 428/418; 523/428

[58] Field of Search ........................ 252/62.54, 62.56, 252/62.57, 62.58, 62.59, 62.6, 62.61, 62.62, 62.63, 62.64; 428/413, 418; 523/428

[56] References Cited

U.S. PATENT DOCUMENTS

| | | | |
|---|---|---|---|
| 4,547,425 | 10/1985 | Naruse | 252/62.54 X |
| 4,601,947 | 7/1986 | Shimada et al. | 252/62.54 X |
| 4,794,042 | 12/1988 | Kubota et al. | 252/62.54 X |
| 4,824,587 | 4/1989 | Kwon et al. | 252/62.55 |
| 4,828,916 | 3/1989 | Yamamoto et al. | 428/329 |

*Primary Examiner*—Richard D. Lovering
*Attorney, Agent, or Firm*—Donald F. Mofford

[57] ABSTRACT

A composition of ferrite and epoxy having the form of a film which can be cut, pressed onto word straps, and heat-cured to form an encapsulating keeper on a plated wire memory. The film comprises ferrite powder in a mixture of epoxy resins, typically Epon 1009 and Epon 828, pulverized dicyandiamide and butadiene/acrylonitrile rubber. The mixture is sprayed onto a sheet of halogenated polyolefin and air dried for 8–12 hours at between 160° F. and 180° F. The resulting flexible film is die cut to fit over word straps and further processed by applying 50–75 psi at 325° F. for one hour.

5 Claims, 1 Drawing Sheet

FERRITE/EPOXY FILM

This invention was made with Government support under Contract No. N00030-84-C-0036, awarded by the Department of the Navy. The Government has certain rights in this invention.

BACKGROUND OF THE INVENTION

This invention relates generally to thermosetting films and, more particularly, to a die-cuttable, B-stageable, thermosetting ferrite/epoxy film which is useful as a magnetic field keeper in a plated wire memory system.

As is known, a plated wire memory comprises a plurality of word straps, typically conductive stripes affixed to a substrate, which are crossed by a multiplicity of plated wires. Because the word straps extend typically 1–2 mils above the surface of the substrate and run in parallel and in close proximity to one another for considerable distances, there tends to be strong interaction among the magnetic fields produced by the currents which are passed through these conductors. As such, it is known to overcoat and fill the channels between the word straps with a material including ferrite to "keep" the magnetic fields, thereby limiting the magnetic field interactions between the word straps.

In the prior art, the method for providing a keeper over the plated wire memory word straps has included providing a ferrite/epoxy composition having sprayable viscosity, and spraying a layer of the composition over the word straps. One such prior art compostion is PC-17, sold by Hysol Co., Olean, N. Y. PC-17 is a bisphenol A-based epoxy resin with a amide curative. Its viscosity starts to increase at room temperature in less than one hour. This relatively short pot life requires that the composition be used immediately, and generally results in a substantial waste factor since excess mixed material cannot be salvaged.

Another drawback of this prior art keeper using an amide cured epoxy lies in the requirement that it must be sprayed onto the word straps. Spray application requires a high degree of skill by the operator in order to ensure a void-free coating. This labor-intensive process also includes masking the areas which are to remain uncoated, sanding the cured outer surface to leave a uniform coating thickness, and removing the excess cured keeper from the borders of the word strap windows.

By way of summary, this prior art method has proven to be complex, unreliable, expensive and requires a high level of skill, and when a spraying error occurs, the entire memory unit may have to be discarded.

SUMMARY OF THE INVENTION

With this background of the invention in mind, it is an object of the present invention to provide an improved ferrite/epoxy film usable as a magnetic field keeper in a plated wire memory system.

It is additionally an object of the present invention to provide an improved method for encapsulating the word straps of a plated wire memory system within a ferrite-based magnetic field keeper.

These and other objects are met by a composition comprising two reactive epoxy resins, a curing agent, rubber and ferrite powder.

The present invention discloses a method for making a ferrite/epoxy film, the method comprising the steps of (a) providing a composition comprising two reactive epoxy resins, a curing agent, a rubber and ferrite powder; (b) solvating and homogenizing the composition; (c) spraying the composition onto a surface to form a film; (d) drying the film in air; and (e) heating the dried film to effect a partial cure.

The present invention further discloses a method of providing a keeper film coating on the word straps of a plated wire memory, the method comprising the steps of (a) providing a composition comprising two reactive epoxy resins, a curing agent, a rubber and ferrite powder; (b) solvating and homogenizing the composition; (c) spraying the composition onto a surface to form a film; (d) drying the film in air; (e) heating the dried film to effect a partial cure; (f) die-cutting the partially-cured film to a shape corresponding to the area encompassing the word straps; and (g) pressing the die-cut film against the word straps at an elevated temperature to finalize the cure of the film.

BRIEF DESCRIPTION OF THE DRAWINGS

The foregoing features of the present invention, and the advantages thereof, may be fully understood from the following detailed description, read in conjunction with the accompanying drawings, wherein.

DETAILED DESCRIPTION OF THE PREFERRED EMBODIMENTS

Figure 1:
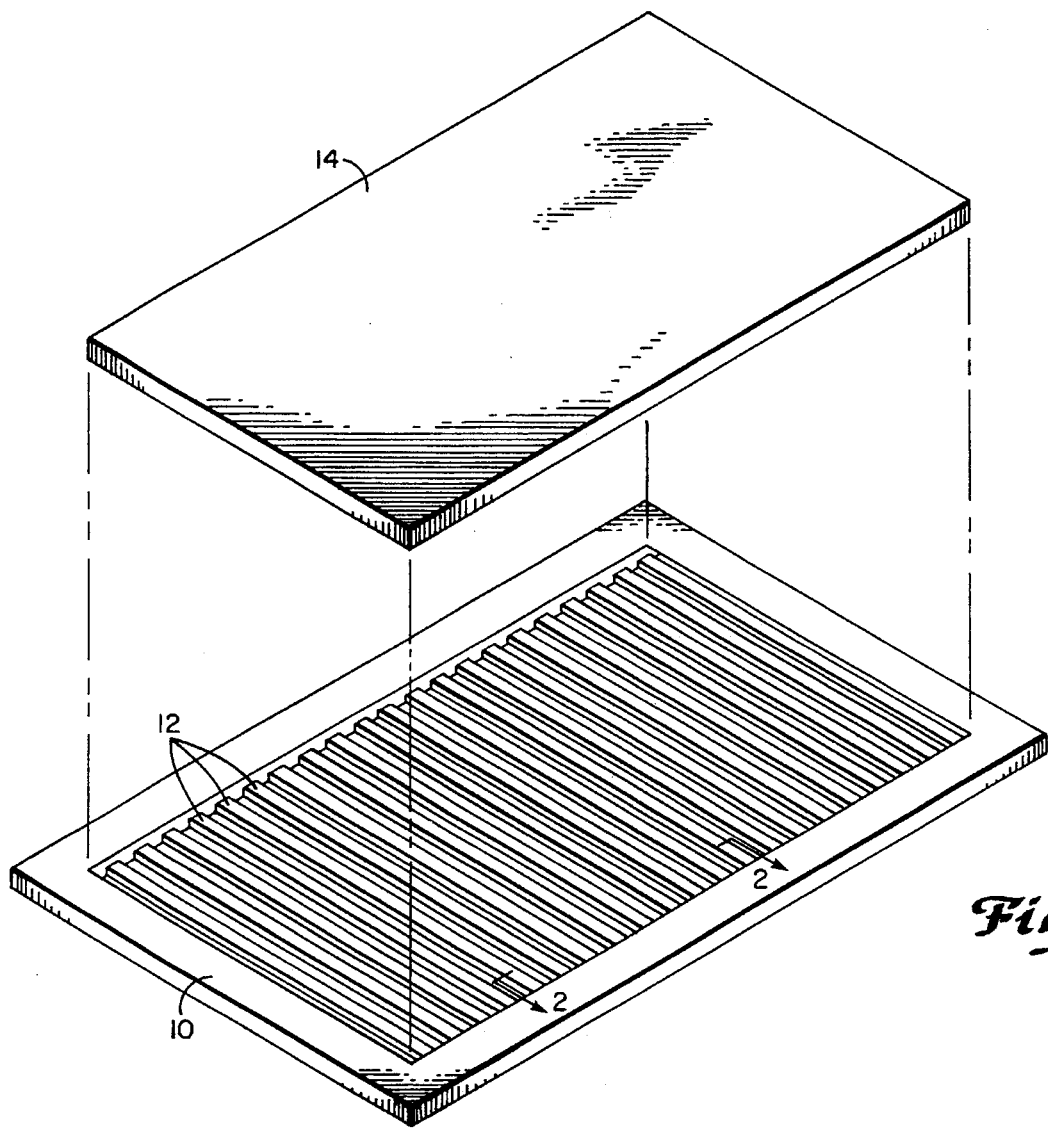
FIG. 1 illustrates a plated wire memory system including a sheet of ferrite/epoxy keeper film of the present invention to be positioned against the word straps.

Referring to FIG. 1, there is shown a portion of a plated wire memory system 10 including a plurality of word straps 12. Also shown is a sheet of ferrite/epoxy keeper film 14, to be positioned on and pressed against word straps 12. The formulation of keeper film 14 is described in detail in later paragraphs of this disclosure of the invention.

Figure 2:
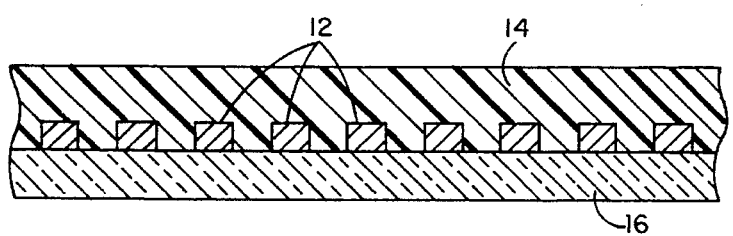
FIG. 2 is a cross-sectional side view of the word straps encapsulated by the ferrite/epoxy keeper film of the present invention.

Referring to FIG. 2, there is shown a cross-sectional side view of word straps 12 affixed to a substrate 16, and encapsulated within ferrite/epoxy keeper film 14. It will be recognized that the depictions of FIGS. 1 and 2 are merely illustrative, and no scaled dimensional information is intended to be conveyed therein. In fact, by way of example, word straps 12 may be 0.002–0.003 inch (2–3 mils) in width, 1–2 mils in height above substrate 16, and they may be spaced from each other by 1–2 mils. The thickness of the encapsulating film 14 above substrate 16 may be 24–28 mils.

In accordance with the present invention, ferrite/epoxy film 14 is formulated of two reactive epoxy resins, a curing agent, rubber and ferrite powder. In the preferred embodiment, the reactive epoxy resins comprise Epon 828 and Epon 1009, both sold by Shell Chemical Division of Shell Oil Company, Houston, Tex. These epoxy resins provide the bulk of the physical and rheological properties of the organic portion of the ferrite/epoxy composition. Both of these resins have structure which can be represented generally as follows:

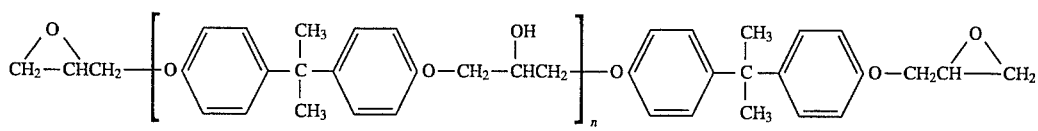

It should be noted that Epon 1009 has the greater number of repeating n groups. Epon 828, a liquid, has an equivalent weight of approximately 140 and Epon 1009, a solid, has an equivalent weight of approximately 3000. Because the oxirane of these materials are attached to methylene bridges, they react very rendily with bases. The combination of these two epoxy resins, in the relative quantities to be disclosed hereinafter, provides a keeper film which is rigid, yet relatively flexible, during the B-staged phase. This condition permits the partially-cured ferrite/epoxy composition to be handled easily, while, under pressure, it can be deformed to encapsulate the memory word straps.

In the preferred embodiment, the curing agent comprises dicyandiamide. This material is an extremely effective latent base epoxy curative. Its structure is as follows:

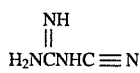

In this embodiment, the dicyandiamide is pulverized into a fine uniform powder.

In the preferred embodiment, the rubber is a reactive thermoplastic rubber which is included in the formulation to toughen the polymer. It acts as a latent reactive flexibilizer for the formulation. In this embodiment, hydroxyl terminated butadiene acrylonitrile rubber, similar to Type HTBN #29, sold by the B. F. Goodrich Company, Cleveland, Ohio, is used. The structure of HTBN #29 is as follows:

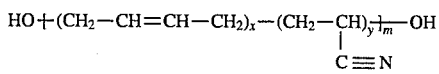

This rubber may react with the epoxy resins through its primary hydroxy groups (OH) or its nitrile groups (C≡N) at elevated temperatures.

In the preferred embodiment, the ferrite powder comprises 85% of the weight of the formulation. The powder granules have a maximum diameter of 400 mesh.

The percentage composition, by weight, of the ferrite/epoxy formulation according to the preferred embodiment is as follows:

| | |
|---|---|
| Shell Epon 1009 epoxy resin | 7.69% |
| Shell Epon 828 epoxy resin | 6.02% |
| Dicyandiamide | 0.43% |
| Hydroxyl terminated butadiene acrylonitrile rubber | 0.86% |
| Ferrite powder | 85.00% |

In accordance with a preferred method for making a die-cuttable, B-stageable, thermosetting ferrite/epoxy film, the above materials, taken in the percentages given, are solvated and homogenized in a glycol ether ester, preferably propylene glycol monomethyl ether acetate. The glycol ether is used to make the mixture sprayable. The resulting material is then sprayed onto a surface comprising a halogenated polyolefin, illustratively PTFE, sold by American Durafilm of Natick, Mass. It is air dried for between eight and twelve hours, and then B-staged, or partially cured, for between four and six hours at between 160° F. and 180° F. (71° C. and 82° C.). As is known, a thermosetting compound is said to be B-stageable if it can be partially cured, then stabilized, and fully cured at a later time. In general, a B-staged compound may be stabilized for a limited time at room temperature; however, polymerization, or hardening, is most effectively retarded by refrigeration or freezing.

The resulting product is a flexible film that can be die cut to fit over the word straps of a plated wire memory system. This film may be packaged and stored at room temperature for up to one week. Under refrigeration, at approximately 40° F. (4° C.), it may be stored for up to three months.

In accordance with a preferred method for providing a keeper film coating on the word straps of a plated wire memory system, the above partially-cured flexible ferrite/epoxy film is die cut to a shape corresponding to the area encompassing the word straps to be covered. This sheet of the film is then pressed against the word straps at a pressure of between 50 and 75 pounds per square inch (psi) at approximately 325° F. (163° C.) for approximately one hour. The pressed film flows uniformly around the word straps providing a void-free encapsulation. The heating process completes the polymerization of the film. By way of illustration, a cured film thickness of 0.024 inch (0.61 mm), provides adequate keeper properties for the above-disclosed memory system word straps are obtained.

While the principles of the present invention have been demonstrated with particular regard to the compositions and methods heretofore disclosed, it will be recognized that various departures from such compositions and methods may be undertaken in the practice of the invention. The scope of this invention is therefore not intended to be limited to the particular compositions and methods disclosed herein, but should instead be gauged by the breadth of the claims which follow.

What is claimed is:

1. A composition comprising:
   first and second reactive epoxy resins having equivalent weights between approximately 140 and 3000, both epoxy resins having oxirane attached to methylene bridges, both epoxy resins being B-stageable;
   a curing agent comprising dicyandiamide;
   a thermoplastic reactive rubber; and ferrite powder.

2. (Amended) The composition according to claim 1 wherein said first epoxy resin comprises a solid at room temperature and said second epoxy resin comprises a liquid at room temperature, and wherein said first and second epoxy resins are combined in a proportion such that said combination is deformable under pressure when said combination is B-staged.

3. The composition according to claim 1 wherein said reactive rubber comprises hydroxyl terminated butadiene acrylonitrile rubber.

4. The composition according to claim 1 wherein said ferrite powder comprises approximately 85 percent of the composition by weight.

5. The composition according to claim 1 wherein said ferrite powder has a maximum fineness of approximately 400 mesh.

* * * * *